(12) United States Patent
Inoue et al.

(10) Patent No.: US 8,664,136 B2
(45) Date of Patent: Mar. 4, 2014

(54) INDIUM OXIDE SINTERED COMPACT AND SPUTTERING TARGET

(75) Inventors: Kazuyoshi Inoue, Chiba (JP); Futoshi Utsuno, Chiba (JP); Hirokazu Kawashima, Chiba (JP); Koki Yano, Chiba (JP); Shigekazu Tomai, Chiba (JP); Masashi Kasami, Chiba (JP); Kota Terai, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 73 days.

(21) Appl. No.: 13/139,563

(22) PCT Filed: Jun. 1, 2009

(86) PCT No.: PCT/JP2009/059954
§ 371 (c)(1),
(2), (4) Date: Jun. 14, 2011

(87) PCT Pub. No.: WO2010/070944
PCT Pub. Date: Jun. 24, 2010

(65) Prior Publication Data
US 2011/0243835 A1    Oct. 6, 2011

(30) Foreign Application Priority Data
Dec. 15, 2008    (JP) ................. 2008-318293

(51) Int. Cl.
*C04B 35/00*    (2006.01)
(52) U.S. Cl.
USPC .................................. 501/126; 501/153
(58) Field of Classification Search
USPC .................. 501/126, 134, 153; 75/232
See application file for complete search history.

(56) References Cited

U.S. PATENT DOCUMENTS

| 4,962,071 | A  | * | 10/1990 | Bayard .................. 501/134 |
| 7,276,187 | B2 | * | 10/2007 | Abe ..................... 252/520.5 |
| 2002/0044243 | A1 | * | 4/2002 | Kim et al. ................ 349/139 |
| 2005/0104128 | A1 | * | 5/2005 | Okumura .................. 257/354 |
| 2011/0050733 | A1 |   | 3/2011 | Yano et al. |

FOREIGN PATENT DOCUMENTS

| JP | 62 088216 | 4/1987 | |
| JP | 2000 143334 | 5/2000 | |
| JP | 2000 169219 | 6/2000 | |
| JP | 2000 169220 | 6/2000 | |
| JP | 2000-169220 A * | 6/2000 | ............ C04B 35/457 |
| JP | 2004 119525 | 4/2004 | |
| WO | 2008096768 A1 | 8/2008 | |

OTHER PUBLICATIONS

Qadri et al. Synthesis of bulk In2O3-Sc2O3 and their transparent conducting oxide films. Journal of Applied Physics, vol. 92, No. 1, pp. 227-229. Jul. 1, 2002.*

(Continued)

*Primary Examiner* — Noah Wiese
(74) *Attorney, Agent, or Firm* — Millen, White, Zelano & Branigan, P.C.

(57) ABSTRACT

A sintered body includes an indium oxide crystal, and an oxide solid-dissolved in the indium oxide crystal, the oxide being oxide of one or more metals selected from the group consisting of aluminum and scandium, the sintered body having an atomic ratio "(total of the one or more metals)/(total of the one or more metals and indium)×100" of 0.001% or more and less than 45%.

25 Claims, 10 Drawing Sheets

(56) References Cited

OTHER PUBLICATIONS

Masahiko, S. "Sintered I.T.O. its production and I.T.O. thin film," Patent Abstracts of Japan, Publication No. 2000-143334; Publication Date: May 23, 2000; English Abstract JP 2000-143334.

International Preliminary Report on Patentability for PCT/JP2009/059954 dated Jul. 14, 2011.

International Search Report for PCT/JP2009/059954 dated Aug. 25, 2009.

Japan Science and Techonology Corp., "Oxide semiconductor pn junction device," Patent Abstracts of Japan, Publication Date: Apr. 15, 2004; English Abstract of JP-2004 119525.

Japan Society for the Promotion of Science, 1$^{st}$ Edition, 2$^{nd}$ Print, Ohmsha, Ltd., Apr. 25, 2000, pp. 197.

Jiomatetsuku KK Tosoh Corp., "Metal oxide sintered compact and its use," Patent Abstracts of Japan, Publication Date: Jun. 20, 2000; English Abstract of JP-2000 169220.

Jiomatetsuku KK Tosoh Corp., "Metal oxide sintered compact and its use," Patent Abstracts of Japan, Publication Date: Jun. 20, 2000; English Abstract of JP-2000 169219.

Qadri, S. B. et al., "Synthesis of bulk In2O3-5c2O3 and their transparent conducting oxide films," Journal of Applied Physics, Jul. 1, 2002, vol. 92, No. 1, pp. 227-229.

Sumitomo Electric Ind Ltd., "Manufacture of transparent conductive film," Japanese Patent Office, Publication Date: Apr. 22, 1987; English Abstract of JP-62 088216.

Office Action for related Taiwan Patent Application No. 98118184 dated Nov. 8, 2013.

\* cited by examiner

INDIUM OXIDE SINTERED COMPACT AND SPUTTERING TARGET

TECHNICAL FIELD

The invention relates to an indium oxide-based sintered body, particularly a sintered body that includes indium oxide and scandium oxide or aluminum oxide, and a sputtering target using the same.

BACKGROUND ART

In recent years, development of displays has rapidly progressed, and various displays such as a liquid crystal display and an EL display have been extensively used for office automation equipment such as a personal computer and a word processor. These displays have a sandwich structure in which a display element is disposed between transparent conductive films.

A silicon-based semiconductor film is mainly used for a switching device (e.g., thin film transistor (TFT)) that drives a display. A silicon-based thin film exhibits excellent stability, excellent workability, a high TFT switching speed, and the like. A silicon-based thin film is generally formed by chemical vapor deposition (CVD).

An amorphous silicon-based thin film has a problem that a high-speed animation or the like cannot be displayed at a high frame rate due to a relatively low switching speed. A crystalline silicon-based thin film achieves a relatively high switching speed, but requires a high temperature of 800° C. or more, laser heating, or the like for crystallization. Specifically, a large amount of energy and a large number of steps are required for producing a crystalline silicon-based thin film. A silicon-based thin film exhibits excellent performance as a voltage device, but shows a change in characteristics with time when causing a current to flow therethrough.

In view of the above situation, an oxide semiconductor film has been studied as a film as an alternative to a silicon-based thin film. For example, Patent Document 1 discloses an oxide semiconductor pn-junction device, and discloses a transparent semiconductor thin film formed of zinc oxide and magnesium oxide as a semiconductor film that forms the device.

A transparent semiconductor thin film formed of zinc oxide and magnesium oxide is etched by a weak acid at a very high etching rate. However, since such a transparent semiconductor thin film is also etched by an etchant used for a metal thin film, the transparent semiconductor thin film may be etched together with a metal thin film formed on the transparent semiconductor thin film when etching the metal thin film. Therefore, the above transparent semiconductor thin film cannot be suitably used when selectively etching only a metal thin film formed on the transparent semiconductor film.

Patent Document 2 discloses an ITO sintered body that contains indium oxide ($In_2O_3$), tin oxide ($SnO_2$), and scandium oxide ($Sc_2O_3$) as the main components so that the weight ratio satisfies the relationships "($In_2O_3+Sc_2O_3$):$SnO_2$=99 to 94:1 to 7" and "$In_2O_3$:$Sc_2O_3$=99.8 to 60:0.2 to 40". The sintered body disclosed in Patent Document 2 contains 1 to 7 wt % of tin oxide, and functions as a conductive film instead of a semiconductor film since carriers are produced from tin oxide.

Patent Document 3 discloses a thin film that contains indium oxide, tin oxide, and yttrium oxide as the main components. Patent Document 3 relates to a transparent conductive film, and is silent about an oxide semiconductor.

An object of the invention is to provide a sintered body (sputtering target) that enables stable film formation of an indium oxide-based oxide semiconductor film.

Another object of the invention is to provide a sputtering target for producing an excellent crystalline oxide semiconductor film.

Patent Document 1: JP-A-2004-119525
Patent Document 2: JP-A-2000-143334
Patent Document 3: JP-A-2000-169219

DISCLOSURE OF THE INVENTION

The invention provides the following sintered body, sputtering target, and the like.

1. A sintered body comprising an indium oxide crystal, and an oxide solid-dissolved in the indium oxide crystal, the oxide being oxide of one or more metals selected from the group consisting of aluminum and scandium, the sintered body having an atomic ratio "(total of the one or more metals)/(total of the one or more metals and indium)×100)" of 0.001% or more and less than 45%.
2. The sintered body according to 1, wherein the atomic ratio is 0.01 to 30 atom %.
3. The sintered body according to 1, wherein the atomic ratio is 0.5 to 15 atom %.
4. The sintered body according to any one of 1 to 3, wherein the indium oxide crystal has a bixbyite structure.
5. The sintered body according to any one of 1 to 4, wherein the indium oxide crystal has a grain size of less than 10 μm.
6. The sintered body according to any one of 1 to 5, comprising indium oxide and scandium oxide, the indium oxide having a lattice constant within a range between the lattice constant of $InScO_3$ and the lattice constant of $In_2O_3$.
7. The sintered body according to any one of 1 to 5, comprising indium oxide and aluminum oxide, the indium oxide having a lattice constant within a range between the lattice constant of $InAlO_3$ and the lattice constant of $In_2O_3$.
8. The sintered body according to any one of 1 to 7, further comprising a metal ion having a positive valence of 4 or more in an amount of 10 to 5000 atomic ppm.
9. The sintered body according to 8, comprising the metal ion having a positive valence of 4 or more in an amount of 100 to 2000 atomic ppm.
10. The sintered body according to 8 or 9, wherein the metal ion having a positive valence of 4 or more is one or both of a tin ion and a cerium ion.
11. A method of producing the sintered body according to any one of 1 to 7, the method comprising mixing a powder of oxide of one or more metals selected from the group consisting of aluminum and scandium with a powder of indium oxide, and firing the mixture at 1200 to 1600° C. for 2 to 200 hours.
12. A method of producing the sintered body according to any one of 8 to 10, the method comprising mixing a powder of oxide of one or more metals selected from the group consisting of aluminum and scandium, a powder of indium oxide, and a powder of a metal having a positive valence of 4 or more, and firing the mixture at 1200 to 1600° C. for 2 to 200 hours.
13. The method according to 11 or 12, wherein the mixture is fired in an oxidizing atmosphere.
14. A sputtering target produced using the sintered body according to any one of 1 to 10.
15. A metal oxide thin film formed using the sputtering target according to 14.
16. A semiconductor film comprising the metal oxide thin film according to 15.

17. A thin film transistor comprising the semiconductor film according to 16.
18. The thin film transistor according to 17, the thin film transistor being a channel-etch thin film transistor.
19. The thin film transistor according to 17, the thin film transistor being an etch-stopper thin film transistor.
20. A semiconductor device comprising the thin film transistor according to any one of 17 to 19.

The above sintered body ensures excellent film-forming stability when used as a sputtering target. An excellent semiconductor film is obtained using the sputtering target.

BEST MODE FOR CARRYING OUT THE INVENTION

Figure 1:
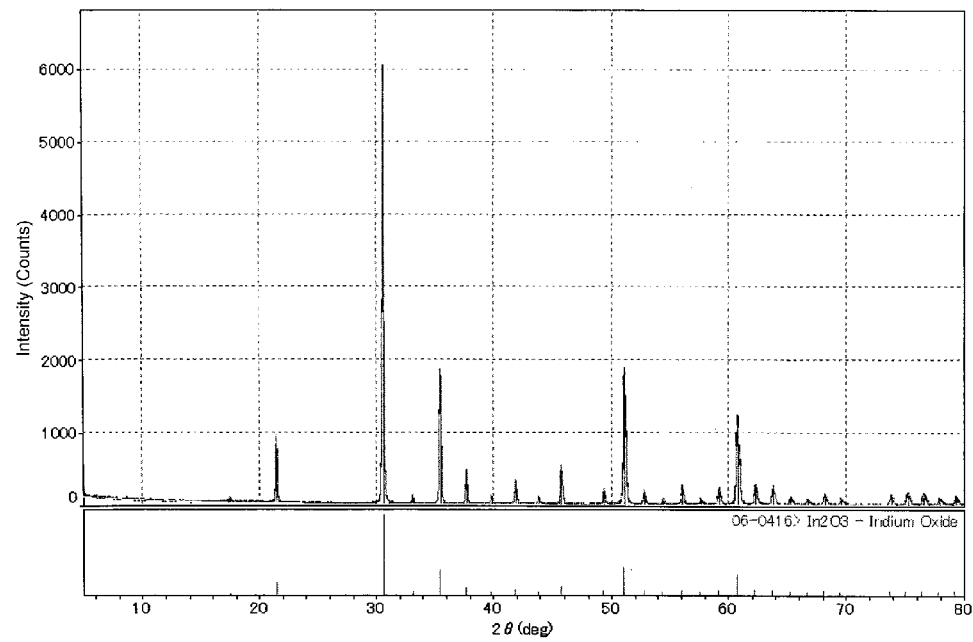
FIG. 1 shows the X-ray diffraction chat of a sintered body produced in Example 1.
Figure 2:
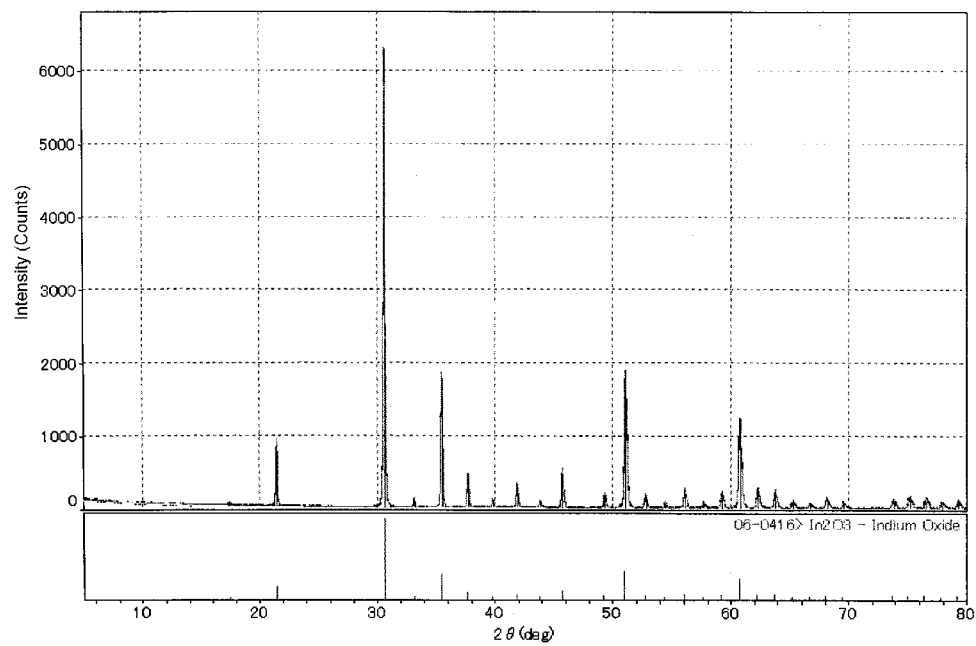
FIG. 2 shows the X-ray diffraction chart of a sintered body produced in Example 2.
Figure 3:
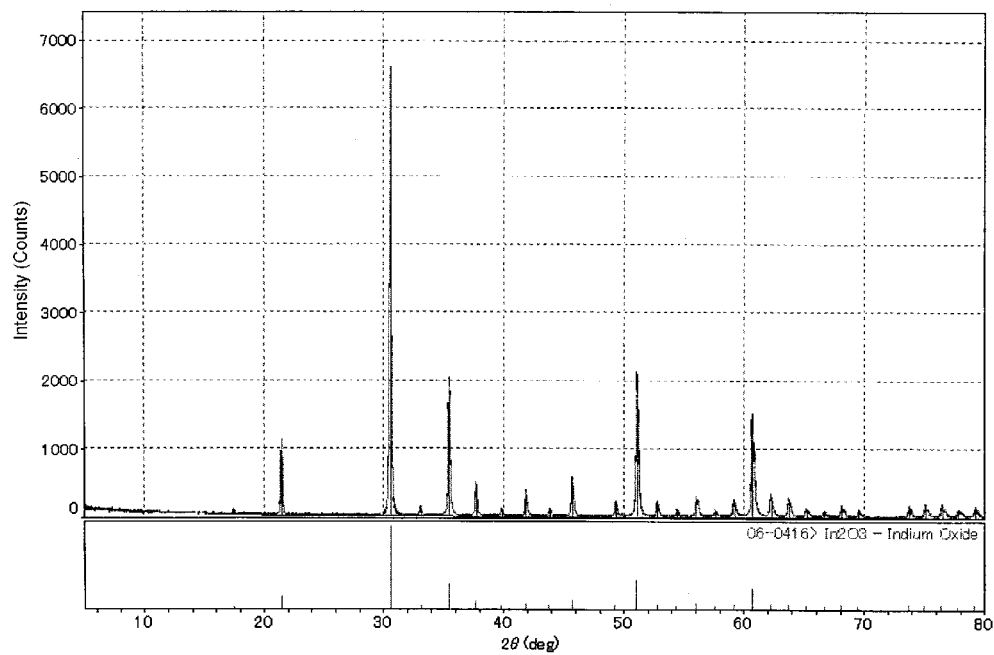
FIG. 3 shows the X-ray diffraction chart of a sintered body produced in Example 3.
Figure 4:
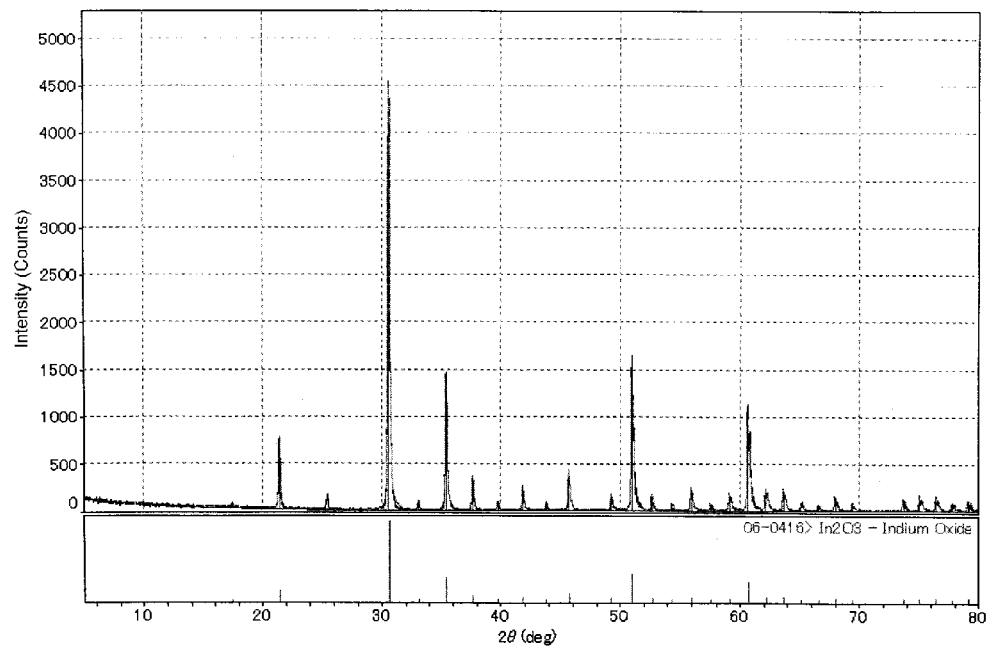
FIG. 4 shows the X-ray diffraction chart of a sintered body produced in Example 4.
Figure 5:
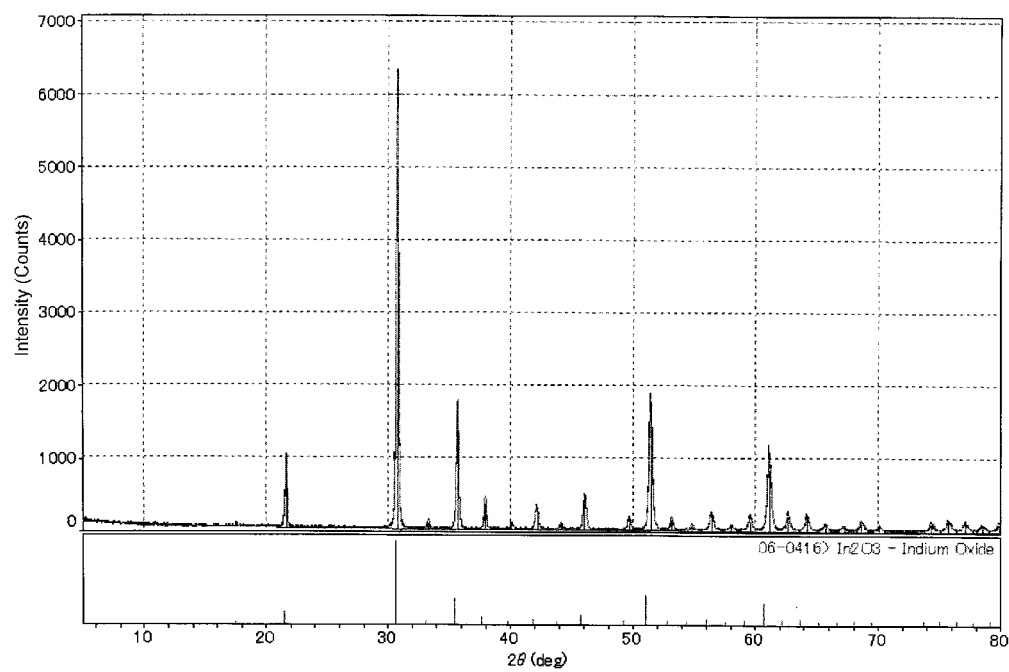
FIG. 5 shows the X-ray diffraction chart of a sintered body produced in Example 5.

A sintered body according to the invention includes an indium oxide crystal, and an oxide solid-dissolved in the indium oxide crystal, the oxide being oxide of one or more metals selected from the group consisting of aluminum and scandium (hereinafter may be referred to as "specific positive trivalent metal"), the sintered body having an atomic ratio "(total of the one or more metals)/(total of the one or more metals and indium)×100)" of 0.001% or more and less than 45%. The atomic ratio is preferably 0.001 to 40 atom %, and more preferably 0.5 to 15 atom %. If the atomic ratio is within the above range, an oxide semiconductor film produced using the sintered body as a sputtering target exhibits high mobility, and a stable thin film transistor can be produced using the oxide semiconductor film.

The content (atomic ratio) of each metal element (ion) in the sintered body may be determined by inductively coupled plasma (ICP) measurement.

The expression "a metal oxide is solid-dissolved in indium oxide" used herein means that a peak attributed to a metal oxide (oxides of aluminum oxide and scandium) (i.e., raw material) added to indium oxide is not observed by X-ray diffraction measurement of the sintered body.

The lattice constant of an indium oxide crystal normally changes linearly toward the lattice constant of indium oxide or the specific positive trivalent metal oxide due to the addition of the specific positive trivalent metal oxide.

The expression "the lattice constant of the sintered body is within a range between the lattice constant of indium oxide and the lattice constant of the specific positive trivalent metal oxide" used herein means that the specific positive trivalent metal oxide is sufficiently solid-dissolved in indium oxide, and no specific positive trivalent metal oxide that causes an abnormal discharge is present in the sintered body. Therefore, a sputtering target produced using the sintered body ensures stable sputtering, and can produce an oxide semiconductor having excellent surface smoothness (flatness). Note that the specific positive trivalent metal oxide may be included in the sintered body in such an amount that an abnormal discharge does not occur.

In the sintered body according to the invention, it is preferable that the specific positive trivalent metal oxide be completely solid-dissolved in indium oxide. This makes it possible to achieve more stable film formation when using the sintered body as a sputtering target.

The specific positive trivalent metal oxide exhibits high reduction resistance, and suppresses reduction of indium oxide. Therefore, occurrence of nodules is suppressed when using a sputtering target that includes the sintered body according to the invention.

The specific positive trivalent metal oxide has a high ability to bond to oxygen. This makes it possible to suppress oxygen deficiency in a crystalline thin film produced using a sputtering target that includes the sintered body according to the invention, so that a semiconductor thin film is easily obtained.

Moreover, since the specific positive trivalent metal oxide exhibits acid resistance and alkali resistance, the resulting thin film exhibits improved acid resistance and alkali resistance.

Since the lattice constant of a crystalline thin film formed of indium oxide decreases due to the addition of the specific positive trivalent metal oxide, the interatomic distance between the cations decreases. Therefore, a transistor produced using the resulting thin film exhibits improved mobility, so that the S value and the durability of the transistor are improved.

The indium oxide crystal included in the sintered body according to the invention preferably has a bixbyite structure. The bixbyite structure can be confirmed by observing a peak by X-ray diffraction measurement.

The indium oxide crystal preferably has a grain size of less than 10 μm. If the grain size of the indium oxide crystal is too large, an abnormal discharge may occur during sputtering, or nodules may be formed on the sputtering target. The grain size of the indium oxide crystal may be reduced by causing oxide of one or more metals selected from the group consisting of aluminum and scandium to be solid-dissolved in the indium oxide crystal.

The grain size (major axis) of the indium oxide crystal refers to the average grain size of the indium oxide crystals included in the entire field of view (30×30 μm) when observing the sintered body using a scanning electron microscope. If a crystal having a grain size of 10 μm or more is not observed within the field of view, the indium oxide crystals have an average grain size of less than 10 μm.

The sintered body according to the invention preferably has a bulk resistance of 1 Ωcm or less, and particularly preferably 0.5 Ωcm or less. The bulk resistance of the sintered body can be adjusted to 1 Ωcm or less by causing one or more metal oxides to be sufficiently dispersed and solid-dissolved therein. If one or more metal oxides are not sufficiently dispersed and solid-dissolved, an abnormal discharge may occur during sputtering. Note that the sintered body need not have a bulk resistance of less than 0.001 Ωcm.

The sintered body according to the invention preferably has a density of 5.5 g/cm³ or more, more preferably 5.8 g/cm³ or more, and particularly preferably 6.0 g/cm³ or more. Note that the upper limit of the density of the sintered body is the density of indium oxide. The density of the sintered body can be adjusted to 5.5 g/cm³ or more by causing one or more metal oxides to be sufficiently dispersed and solid-dissolved therein. If the sintered body has a low density, the surface of the target may blacken during sputtering, so that an abnormal discharge may occur. Moreover, the sputtering rate may decrease.

The relative density of the sintered body can be adjusted to 90% or more by causing one or more metal oxides to be sufficiently dispersed and solid-dissolved therein. If the oxide sintered body has a low relative density, an abnormal discharge may occur due to blackening of the surface of the target, or the sputtering rate may decrease. The relative density of the sintered body is preferably 95% or more, and more preferably 97% or more. The upper limit of the relative density is 100% or less.

A sintered body according to a preferred embodiment of the invention includes indium oxide and scandium oxide, the indium oxide having a lattice constant within a range between the lattice constant of $InScO_3$ and the lattice constant of $In_2O_3$.

A sintered body according to another preferred embodiment of the invention includes indium oxide and aluminum oxide, the indium oxide having a lattice constant within a range between the lattice constant of $InAlO_3$ and the lattice constant of $In_2O_3$.

The above sintered body preferably includes a metal ion having a positive valence of 4 or more in an amount of 10 to 5000 atomic ppm, and particularly preferably 100 to 2000 atomic ppm. The bulk resistance of the sintered body can be further reduced due to a metal element having a positive valence of 4 or more. If the content of a metal ion having a positive valence of 4 or more exceeds 5000 ppm, the resulting oxide semiconductor film may not exhibit normally-off semiconductor properties. It is preferable that a metal oxide having a positive valence of 4 or more be also solid-dissolved in indium oxide (i.e., a peak attributed to a metal oxide having a positive valence of 4 or more is not observed). The bulk resistance of the resulting sintered body decreases due to the addition of a positive tetravalent metal oxide. A sputtering target produced using such a sintered body ensures more stable sputtering, and can stably produce an oxide semiconductor film having excellent surface smoothness.

Examples of the metal ion having a positive valence of 4 or more include Ti, Zr, Hf, Nb, Ta, W, Ge, Sn, and Ce. The metal ion having a positive valence of 4 or more is preferably one or both of a tin ion and a cerium ion. $SnO_2$ is abundantly available (i.e., $SnO_2$ supply is stable), and has no toxicity. A small amount (5000 atomic ppm or less) of cerium is incorporated in the indium oxide crystal at the sintering temperature (1200° C. or more) of the sintered body, so that the bulk resistance of the sintered body decreases. The amount of cerium incorporated in indium oxide decreases at the crystallization temperature (e.g., about 250° C. to about 450° C.) of the thin film, so that the effect of reducing the bulk resistance (i.e., the effect of producing carriers) decreases. An oxide semiconductor that exhibits normally-off semiconductor properties can be easily obtained by thus controlling carriers in the resulting crystalline indium oxide film.

The sintered body according to the invention has low bulk resistance, and may suitably be used as a sputtering target. A sputtering target produced using the sintered body ensures stable sputtering, and can stably produce a crystalline indium oxide film. It is also possible to produce a thin film having excellent semiconductor properties.

The sintered body according to the invention may be produced by sintering (firing) a powder mixture prepared by mixing indium oxide with scandium oxide or aluminum oxide at 1200 to 1600° C. for 2 to 200 hours, for example.

Each oxide used as the raw material is preferably a powder having a purity of 99.99% or more. When adding a metal element having a positive valence of 4 or more, a compound (e.g., oxide) of the metal element is used. The compound of the metal element preferably has a purity of 99.99% or more. If each raw material has a purity of 99.99% or more, the impurity content is reduced to less than 100 atomic ppm.

The amount of each raw material is determined depending on the amount of each metal element included in the desired sintered body.

The raw material mixture is mixed and ground using a mill (e.g., bead mill, ball mill, or planetary mill). The mixture is then granulated, and shaped into a shape suitable for a sputtering target or the like.

The mixture may be shaped by pressing, cold isostatic pressing, uniaxial pressing, die forming, casting, injection molding, or the like. A molding aid such as polyvinyl alcohol, methyl cellulose, polywax, or oleic acid may be used when shaping the mixture.

The shaped product is sintered at 1200 to 1600° C. for 2 to 200 hours to obtain a sintered body.

If the sintering temperature is less than 1200° C., a highly dense sintered body may not be obtained. If the sintering temperature exceeds 1600° C., indium oxide and scandium oxide may be pyrolyzed. The sintering temperature is preferably 1300 to 1600° C., and more preferably 1300 to 1550° C.

The sintering time is 2 to 200 hours. If the sintering time is less than 2 hours, the shaped product may not be completely sintered, so that a highly dense sintered body may not be obtained. If the sintering time exceeds 200 hours, it may be disadvantageous from the economical point of view. The sintering time is preferably 5 to 150 hours, and more preferably 10 to 100 hours.

The shaped product is preferably sintered in an oxidizing atmosphere. The oxidizing atmosphere may be air, an oxygen stream, or a pressurized oxygen atmosphere.

The sintered body is cut or ground to a desired shape, and bonded to a backing plate to obtain a sputtering target.

A metal oxide thin film according to the invention is formed in a film using the above sputtering target. The metal oxide thin film is optionally annealed after film formation. The metal oxide thin film is a semiconductor thin film, and may be used for a thin film transistor (e.g., channel-etch thin film transistor or etch-stopper thin film transistor).

EXAMPLES

The invention is further described below by way of examples and comparative examples. Note that the invention is not limited to the following examples that illustrate preferred examples. The invention also includes various modifications and other examples that are based on the technical concept of the invention.

Example 1

The following oxide powders were used as raw material powders. The specific surface area of each powder was measured by the BET method.
(a) Indium oxide powder (specific surface area: 6 m²/g)
(b) Scandium oxide powder (specific surface area: 3 m²/g)

The powder mixture had a specific surface area of 6.0 m²/g.

A powder mixture of 990 g of indium oxide and 10 g of scandium oxide was mixed and ground using an agitator bead mill with a wet medium. Zirconia beads having a diameter of 1 mm were used as the media. The specific surface area of the raw material powder mixture was increased by 2 m²/g by grinding while checking the specific surface area of the raw material powder mixture.

The ground powder mixture was dried using a spray dryer, put in a die (diameter: 100 mm, thickness: 20 mm), and pressed using a cold press machine.

The shaped product was sintered at 1500° C. for 20 hours in an oxygen atmosphere (in which oxygen was circulated) to obtain a sintered body.

FIG. 1 shows the X-ray diffraction chart of the sintered body produced in Example 1. As a result of analyzing the X-ray diffraction chart, an $In_2O_3$ bixbyite structure was included in the sintered body. The lattice constant calculated from the X-ray diffraction analysis results was 10.115 Å.

The measured lattice constant almost coincided with the theoretical lattice constant (see FIG. 9), and a peak attributed to $Sc_2O_3$ (raw material) was not observed even if the X-ray diffraction chart was magnified by a factor of 10. It was thus confirmed that scandium oxide was solid-dissolved in the indium oxide crystal.

The density of the sintered body calculated from the weight and the external dimensions of the sintered body cut to a given size was 6.7 g/cm³. The sintered body had a high density, and may suitably be used as a sputtering target sintered body.

The bulk resistance of the sintered body measured by a four-probe method using a resistance meter ("Loresta" manufactured by Mitsubishi Chemical Corporation) was 0.9 Ωcm.

The atomic ratio "Sc/(In+Sc)" in the sintered body determined by ICP measurement was 0.02.

The crystal grain size of the sintered body was 4.8 μm. Note that the average grain size of the indium oxide crystals included in the entire field of view (30×30 μm) when observing the sintered body using a scanning electron microscope was taken as the crystal grain size.

Table 1 shows the sintering conditions, the properties of the sintered body, and the like.

The presence or absence of nodules generated during sputtering was evaluated under the following conditions.

Specifically, a 4-inch target was installed in a sputtering apparatus (manufactured by Shimadzu Corporation). DC magnetron sputtering (power: 10 kWhr, output: 400 W) was performed in an argon gas (100%) atmosphere, and the presence or absence of nodules formed on the surface of the target was observed with the naked eye. A case where nodules were continuously formed in the inner circumferential area and the outer circumferential area of erosion was evaluated as "occurred".

The presence or absence of an abnormal discharge was evaluated under the following conditions.

Specifically, a 4-inch target was installed in a sputtering apparatus (manufactured by Shimadzu Corporation). DC magnetron sputtering (power: 9 kWhr, output: 400 W) was performed in an argon gas atmosphere, and the voltage during sputtering was monitored for 5 minutes. It was determined that an abnormal discharge occurred when the voltage decreased by 10% or more. A case where an abnormal discharge occurred 10 times or more was evaluated as "Occurred", and a case where an abnormal discharge occurred less than 10 times was evaluated as "Did not occur". An abnormal discharge is normally observed 100 times or more when an abnormal discharge has occurred.

TABLE 1

|  | Sc/(In + Sc) (at %) | Sintering temperature (° C.) | Sintering time (hour) | Lattice constant (Å) | Density (g/cm³) | Crystal grain size (μm) | Bulk resistance (Ωcm) | Nodule | Abnormal discharge |
|---|---|---|---|---|---|---|---|---|---|
| Example 1 | 2 | 1500 | 20 | 10.115 | 6.7 | 4.8 | 0.9 | Did not occur | Did not occur |
| Example 2 | 6 | 1500 | 20 | 10.1013 | 6.5 | 3.1 | 0.95 | Did not occur | Did not occur |
| Example 3 | 9.6 | 1500 | 20 | 10.09139 | 6.3 | 4.2 | 1.2 | Did not occur | Did not occur |
| Example 4 | 18 | 1500 | 20 | 10.06461 | 6.2 | 4.7 | 1.5 | Did not occur | Did not occur |
| Example 5 | 34 | 1500 | 20 | 10.03689 | 5.8 | 8.6 | 8.7 | Did not occur | Did not occur |
| Com. Ex. 1 | 0.0 | 1500 | 20 | 10.1184 | 6.4 | 16.4 | 1.0 | Blackening | Occurred |
| Com. Ex. 2 | 9.6 | 1100 | 20 | 10.1162 | 5.2 | 12.3 | 140 | Blackening | Occurred |
| Com. Ex. 3 | 46 | 1500 | 20 | 9.99615 | 4.9 | 15.8 | — | Blackening | Occurred |

Examples 2 to 5

A sintered body was produced and evaluated in the same manner as in Example 1, except for changing the atomic ratio "Sc/(In +Sc)", the sintering temperature, and the sintering time as shown in Table 1. The evaluation results are shown in Table 1. FIGS. 2 to 5 respectively show the X-ray diffraction charts of the sintered bodies produced in Examples 2 to 5.

Note that the measured lattice constant almost coincided with the theoretical lattice constant (see FIG. 9), and a peak attributed to $Sc_2O_3$ (raw material) was not observed even if the X-ray diffraction chart was magnified. It was thus confirmed that scandium oxide was solid-dissolved in the indium oxide crystal.

Example 6

A sintered body was produced in the same manner as in Example 2, except for using cerium oxide ($CeO_2$) in addition to indium oxide and scandium oxide so that the Ce content was 800 atomic ppm or 1200 atomic ppm based on the total metal elements. The resulting sintered bodies had a density of 6.5 g/cm³, and a bulk resistance of 0.015 Ωcm or 0.011 Ωcm, respectively. It was thus confirmed that the bulk resistance of the sintered body can be reduced by adding a metal element having a positive valence of 4 or more. A peak of a bixbyite structure attributed to indium oxide was observed by X-ray diffraction. The sintered bodies had a lattice constant of 10.1015 Å or 10.1019 Å, respectively. A peak attributed to $Sc_2O_3$ or $CeO_2$ (raw material) was not observed.

Comparative Example 1

Figure 6:
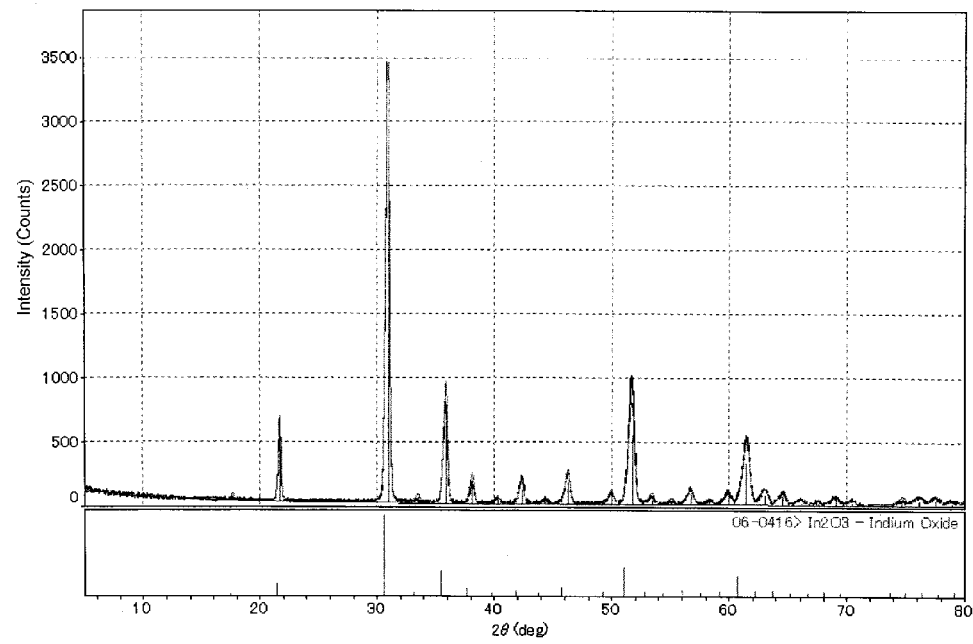
FIG. 6 shows the X-ray diffraction chart of a sintered body produced in Comparative Example 1.
Figure 7:
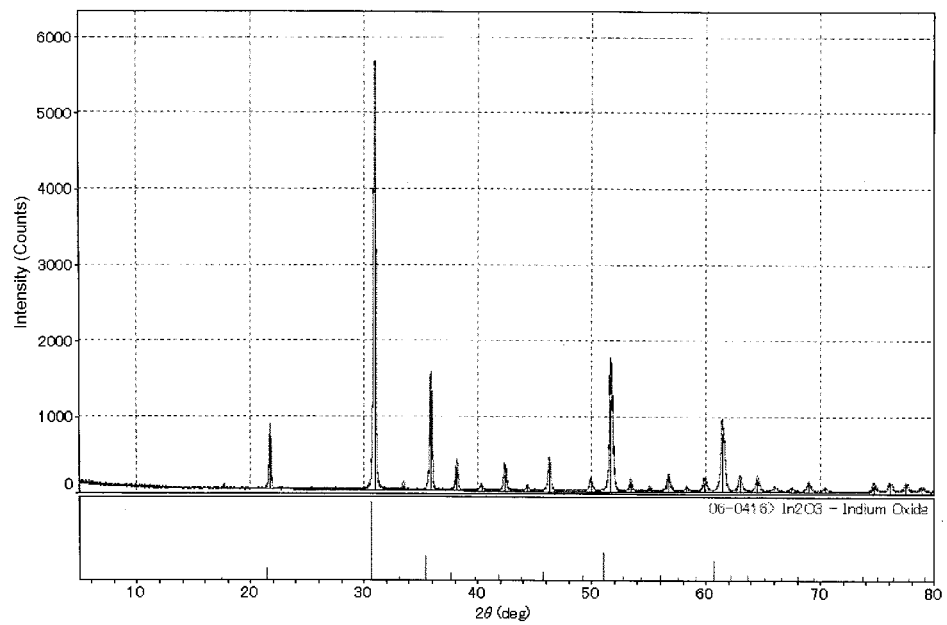
FIG. 7 shows the X-ray diffraction chart of a sintered body produced in Comparative Example 2.
Figure 8:
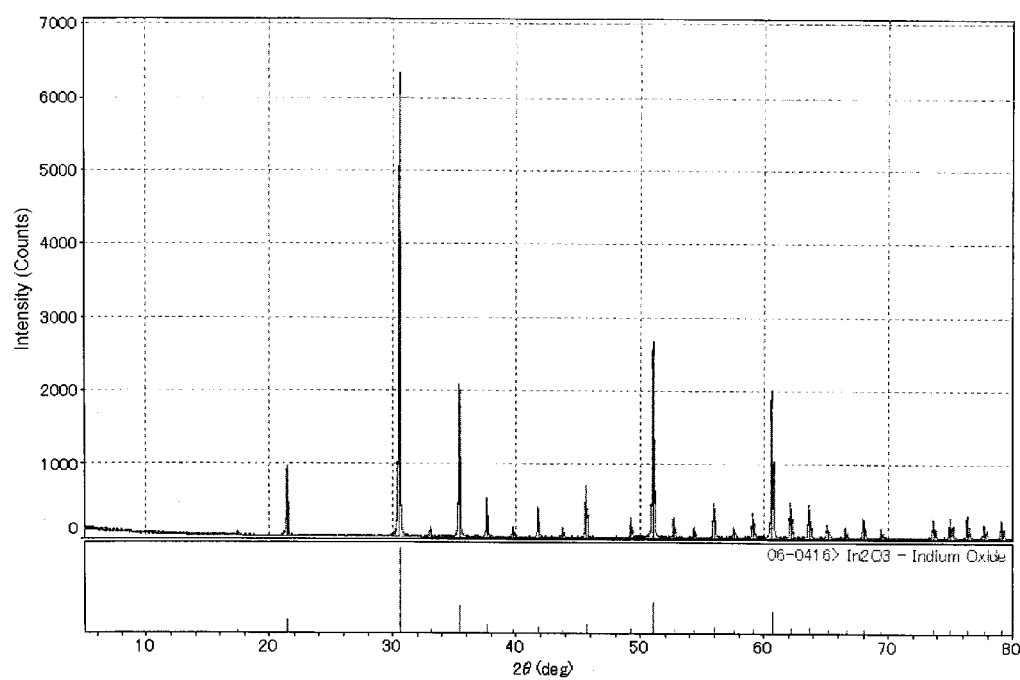
FIG. 8 shows the X-ray diffraction chart of a sintered body produced in Comparative Example 3.

A sintered body was produced and evaluated in the same manner as in Example 1, except for using only 1000 g of indium oxide without using scandium oxide, and changing the sintering temperature and the sintering time as shown in Table 1. The evaluation results are shown in Table 1. FIG. 6 shows the X-ray diffraction chart of the sintered body produced in Comparative Example 1.

It was confirmed that the sintered body produced in Comparative Example 1 had a large crystal grain size as compared with the sintered bodies produced in the examples.

Comparative Example 2

A sintered body was produced and evaluated in the same manner as in Example 3, except for changing the sintering temperature and the sintering time as shown in Table 1. The evaluation results are shown in Table 1.

It was confirmed that the sintered body produced in Comparative Example 2 had a large crystal grain size as compared with the sintered bodies produced in the examples. A peak attributed to scandium oxide was observed in addition to a peak attributed to the solid solution of indium oxide and scandium oxide when magnifying the X-ray diffraction chart. It was thus confirmed that scandium oxide was not solid-dissolved in the indium oxide crystal.

Comparative Example 3

A sintered body was produced and evaluated in the same manner as in Example 1, except for using indium oxide and scandium oxide in the atomic ratio shown in Table 1, and changing the sintering temperature and the sintering time as shown in Table 1. The evaluation results are shown in Table 1.

It was confirmed that the sintered body produced in Comparative Example 3 had a low density as compared with the sintered bodies produced in the examples. The lattice constant determined from the X-ray diffraction results almost coincided with the theoretical line when scandium oxide is solid-dissolved in indium oxide. However, a peak attributed to scandium oxide was observed in addition to a peak attributed to the solid solution of indium oxide and scandium oxide when magnifying the X-ray diffraction chart. It was thus confirmed that scandium oxide was not solid-dissolved in the indium oxide crystal. Since the sintered body produced in this comparative example had low strength due to low density and a large crystal grain size, the sintered body was not processed into a target.

Figure 9:
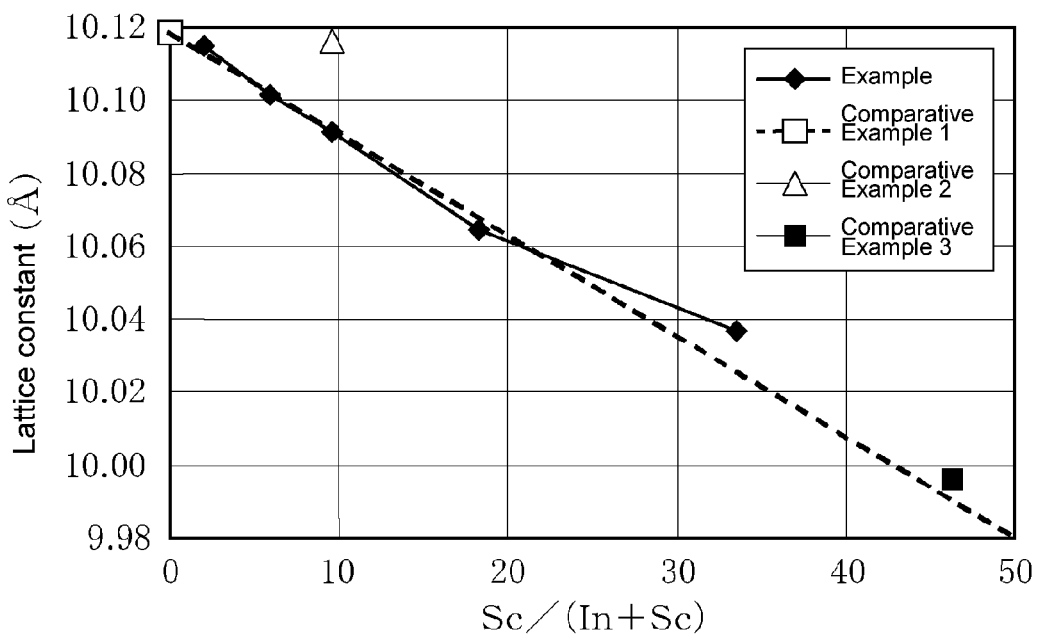
FIG. 9 shows a change in lattice constant of a sintered body due to a change in amount of scandium oxide.

FIG. 9 shows the relationship between the lattice constant of the bixbyite structure of $In_2O_3$ and the amount of $Sc_2O_3$ in the sintered bodies produced in the examples and the comparative examples. In FIG. 9, the dotted straight line indicates the theoretical lattice constant. When a peak attributed to $Sc_2O_3$ (raw material) is not observed in the X-ray diffraction pattern, the measured lattice constant coincides or almost coincides with the theoretical value. In this case, it is determined that scandium oxide is solid-dissolved.

Evaluation Example 1

(A) Production of Thin Film Transistor

Figure 10:
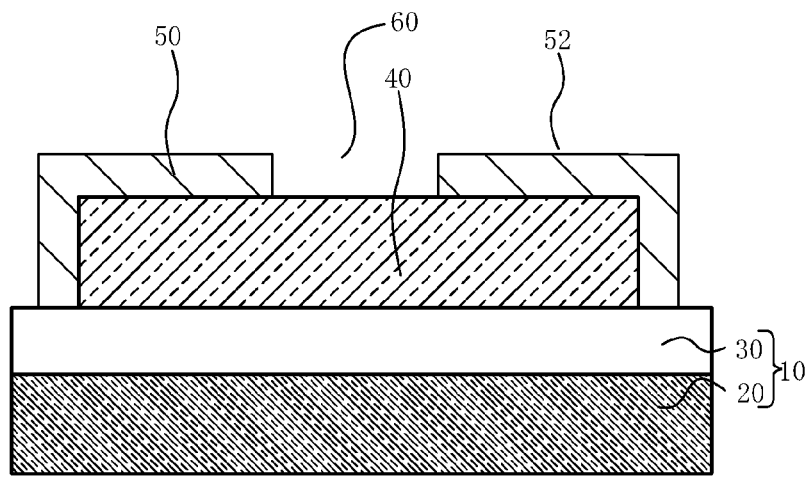
FIG. 10 is a schematic cross-sectional view showing a thin film transistor produced in Evaluation Example 1.

A channel-etch thin film transistor shown in FIG. 10 was produced by a photoresist method.

A conductive silicon substrate 10 provided with a thermally oxidized film ($SiO_2$ film) (thickness: 200 nm) was used. The thermally oxidized film functions as a gate insulating film 30, and the conductive silicon part functions as a gate electrode 20.

An oxide film (thickness: 40 nm) (i.e., a precursor of a semiconductor film 40) was formed in a film on the gate insulating film 30 by a sputtering method using a sputtering target (Sc/(In+Sc)=0.06) formed of the sintered body produced in Example 2. Specifically, the atmosphere was evacuated until the back pressure became $5 \times 10^{-4}$ Pa, and the sputtering process was performed at room temperature at a pressure of 0.2 Pa and a sputtering power of 100 W while introducing argon (9.5 sccm) and oxygen (0.5 sccm).

A resist was applied to the substrate on which the oxide film was formed, and pre-baked at 80° C. for 15 minutes to form a resist film. The resist film was then irradiated with UV light (intensity: 300 mJ/cm$^2$) through a mask, and developed using 3 wt % tetramethylammonium hydroxide (TMAH). The resist film was then washed with purified water, and post-baked at 130° C. for 15 minutes to form a resist pattern having the desired shape.

The oxide film formed on the substrate provided with the resist pattern was etched using a mixed acid of phosphoric acid, acetic acid, and nitric acid. After removing the resist, the substrate was washed with purified water, and dried by blowing air.

The substrate was then heated at 300° C. for 30 minutes in air inside a hot-blast heating furnace so that the oxide film became a semiconductor to obtain a semiconductor film 40.

A molybdenum metal film was then formed on the semiconductor film 40 and the gate insulating film 30 to a thickness of 300 nm.

A resist was applied to the molybdenum metal film, and pre-baked at 80° C. for 15 minutes to form a resist film. The resist film was then irradiated with UV light (intensity: 300 ml/cm$^2$) through a mask, and developed using 3 wt % tetramethylammonium hydroxide (TMAH). The resist film was then washed with purified water, and post-baked at 130° C. for 15 minutes to form a source/drain electrode resist pattern.

The molybdenum metal film formed on the substrate provided with the resist pattern was etched using a mixed acid of phosphoric acid, acetic acid, and nitric acid to form a channel region 60, a source electrode 50, and a drain electrode 52. The substrate was then washed with purified water, and dried by blowing air to obtain a thin film transistor in which the distance (L) between the source electrode and the drain electrode was 200 µm, and the width (W) of the channel region 60 was 500 µm. The semiconductor film 40 under the channel region was not etched. A crystallized indium oxide film has resistance against (is not dissolved in) a mixed acid of phosphoric acid, acetic acid, and nitric acid. Therefore, a channel-etch thin film transistor can be easily produced.

A normally-off thin film transistor having a field-effect mobility of 17.3 cm$^2$/V·sec, an on-off ratio of 10$^7$, and an S value of 0.9 was thus obtained. The thin film transistor had clear pinch-off output characteristics. The threshold voltage (Vth) after applying a voltage of 20 V to the gate electrode for 100 minutes was 0.2 V.

(B) Evaluation of Semiconductor Film

An indium oxide film including scandium oxide was formed on a quartz glass substrate under the same conditions as the sputtering conditions employed in (A). The indium oxide film was then heated at 300° C. for 30 minutes in air inside a hot-blast heating furnace. As a result of X-ray diffraction (XRD) measurement of the resulting semiconductor film, an X-ray diffraction pattern indicating only a peak derived from an indium oxide structure was obtained. It was thus confirmed that the semiconductor film was crystalline. Since the lattice constant of the crystalline semiconductor film was smaller than that of an indium oxide thin film, it was considered that high mobility was achieved.

The carrier concentration determined by hole measurement was $5.7 \times 10^{+16}/\text{cm}^3$.

Example 6

The following oxide powders were weighed and used as raw material powders. The specific surface area of each powder was measured by the BET method.
(a) Indium oxide powder (specific surface area: $6 \text{ m}^2/\text{g}$)
(b) Aluminum oxide powder (specific surface area: $6 \text{ m}^2/\text{g}$)
A powder mixture of the powders (a) and (b) had a specific surface area of $6.0 \text{ m}^2/\text{g}$.

A powder mixture of 995 g of indium oxide and 5 g of aluminum oxide was mixed and ground using an agitator bead mill with a wet medium. Zirconia beads having a diameter of 1 mm were used as the media. The specific surface area of the raw material powder mixture was increased by $2 \text{ m}^2/\text{g}$ by grinding while checking the specific surface area of the raw material powder mixture.

The ground raw material powder mixture was dried using a spray dryer, put in a die (diameter: 100 mm, thickness: 20 mm), and pressed using a cold press machine. The shaped product was sintered at 1550° C. for 20 hours in an oxygen atmosphere (in which oxygen was circulated) to obtain a sintered body.

As a result of analyzing the X-ray diffraction chart, an $In_2O_3$ bixbyite structure was included in the sintered body. A peak attributed to aluminum oxide (raw material) was not observed. The lattice constant was 10.11587.

The density, the bulk resistance, the crystal grain size, the presence or absence of nodules, and the presence or absence of an abnormal discharge were measured and evaluated in the same manner as in Example 1. The results are shown in Table 2.

Examples 7 to 10 and Comparative Examples 4 and 5

A sintered body was produced and evaluated in the same manner as in Example 6, except for mixing indium oxide and aluminum oxide in the ratio shown in Table 2, and changing the sintering temperature and the sintering time as shown in Table 2. The results are shown in Table 2.

Figure 11:
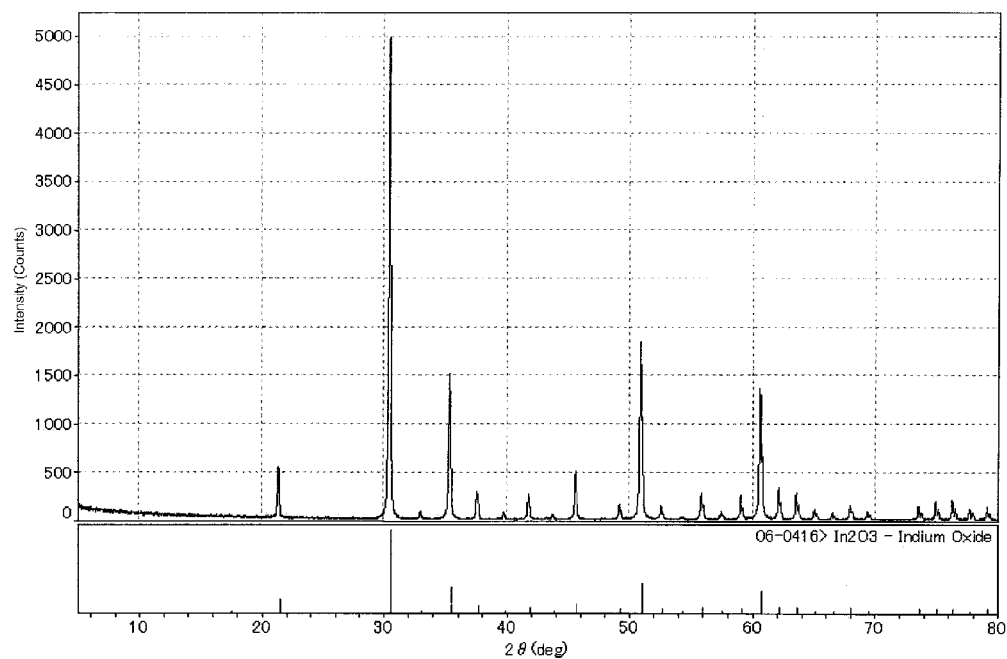
FIG. 11 shows the X-ray diffraction chart of a sintered body produced in Example 9.

FIG. 11 shows the X-ray diffraction chart of the sintered body produced in Example 9.

$6.56 \text{ g/cm}^3$, and a bulk resistance of $0.017 \text{ }\Omega\text{cm}$ or $0.009 \text{ }\Omega\text{cm}$, respectively. It was thus confirmed that the bulk resistance of the sintered body can be reduced by adding a metal element having a positive valence of 4 or more. A peak of a bixbyite structure attributed to indium oxide was observed by X-ray diffraction. The sintered bodies had a lattice constant of 10.1015 Å or 10.1019 Å, respectively. A peak attributed to $Al_2O_3$ or $CeO_2$ (raw material) was not observed.

Evaluation Example 2

(A) Production of Thin Film Transistor
A channel-etch thin film transistor shown in FIG. 10 was produced in the same manner as in Evaluation Example 1(A), except for using the sputtering target produced in Example 8.

A normally-off thin film transistor having a field-effect mobility of $49.3 \text{ cm}^2/\text{V} \cdot \text{sec}$, an on-off ratio of $10^7$, and a S value of 0.89 was thus obtained. The thin film transistor had clear pinch-off output characteristics. The threshold voltage (Vth) after applying a voltage of 20 V to the gate electrode for 100 minutes was 0.2 V.

(B) Evaluation of Semiconductor Film
A semiconductor film was formed and heated in the same manner as in Evaluation Example 1(B), except for using the sputtering target produced in Example 8. As a result of X-ray diffraction (XRD) measurement of the resulting semiconductor film, an X-ray diffraction pattern indicating only a peak of an indium oxide structure was obtained. It was thus confirmed that the semiconductor film was crystalline. The carrier concentration determined by hole measurement was $5.7 \times 10^{+16}/\text{cm}^3$.

INDUSTRIAL APPLICABILITY

The sintered body according to the invention may be used as a sputtering target for forming an indium oxide-based semiconductor film. A film produced using the sputtering target according to the invention may be used for a transistor.

The invention claimed is:
1. A sintered body comprising an indium oxide crystal, and aluminum oxide solid-dissolved in the indium oxide crystal, the sintered body having an atomic ratio of indium and aluminum defined as the (aluminum/(total of aluminum and indium)×100) of 2.7% or more and less than 45%, and com-

TABLE 2

|  | Al/(In + Al) (at %) | Sintering temperature (° C.) | Lattice constant (Å) | Density (g/cm³) | Crystal grain size (μm) | Bulk resistance (Ωcm) | Nodule | Abnormal discharge |
|---|---|---|---|---|---|---|---|---|
| Example 6 | 0.4 | 1550 | 10.11587 | 7.02 | 4.7 | 0.081 | Did not occur | Did not occur |
| Example 7 | 2.7 | 1550 | 10.11334 | 6.95 | 4.4 | 0.097 | Did not occur | Did not occur |
| Example 8 | 7.8 | 1500 | 10.10831 | 6.56 | 4.2 | 0.12 | Did not occur | Did not occur |
| Example 9 | 12.5 | 1500 | 10.10237 | 6.41 | 4.0 | 0.34 | Did not occur | Did not occur |
| Example 10 | 23.2 | 1500 | 10.09395 | 5.86 | 3.2 | 0.8 | Did not occur | Did not occur |
| Com. Ex. 4 | 0.0 | 1500 | 10.1184 | 6.54 | 16.4 | 1.0 | Blackening | Occurred |
| Com. Ex. 5 | 50 | 1500 | 10.06137 | 4.26 | — | Could not be measured | Discharge did not occur | Discharge did not occur |

Could not be measured: insulator

Example 11

A sintered body was produced in the same manner as in Example 8, except for using cerium oxide ($CeO_2$) in addition to indium oxide and aluminum oxide so that the Ce content was 800 atomic ppm or 1200 atomic ppm based on the total metal elements. The resulting sintered bodies had a density of prising a metal ion having a positive valence of 4 or more in an amount of 10 to 5000 atomic ppm.

2. The sintered body according to claim 1, wherein the atomic ratio is 2.7 to 30 atom %.

3. The sintered body according to claim 1, wherein the atomic ratio is 2.7 to 15 atom %.

4. The sintered body according to claim 1, wherein the indium oxide crystal has a bixbyite structure.

5. The sintered body according to claim 1, wherein the indium oxide crystal has a grain size of less than 10 μm.

6. The sintered body according to claim 1, wherein the indium oxide crystal in which aluminum oxide is solid-dissolved has a lattice constant within a range between the lattice constant of $InAlO_3$ and the lattice constant of $In_2O_3$.

7. The sintered body according to claim 1, comprising the metal ion having a positive valence of 4 or more in an amount of 100 to 2000 atomic ppm.

8. The sintered body according to claim 1, wherein the metal ion having a positive valence of 4 or more is one or both of a tin ion and a cerium ion.

9. A method of producing the sintered body according to claim 1, the method comprising mixing a powder of aluminum oxide, a powder of indium oxide, and a powder of a metal having a positive valence of 4 or more, and firing the mixture at 1200 to 1600° C. for 2 to 200 hours.

10. A method of producing a sintered body comprising an indium oxide crystal, and aluminum oxide solid-dissolved in the indium oxide crystal, the sintered body having an atomic ratio of indium and aluminum defined as the (aluminum/(total of aluminum and indium)×100) of 2.7% or more and less than 45%, the method comprising mixing a powder of aluminum oxide with a powder of indium oxide, and firing the mixture at 1200 to 1600° C. for 2 to 200 hours.

11. The method according to claim 10, wherein the mixture is fired in an oxidizing atmosphere.

12. A sintered body consisting of indium oxide and aluminum oxide, the aluminum oxide being solid-dissolved in the indium oxide crystal, the sintered body having an atomic ratio of indium and aluminum defined as the (aluminum/(total of aluminum and indium)×100) of 0.001% or more and less than 45%.

13. The method of producing the sintered body according to claim 12, the method comprising mixing a powder of aluminum oxide with a powder of indium oxide, and firing the mixture at 1200 to 1600° C. for 2 to 200 hours.

14. A sputtering target produced by the sintered body according to claim 12.

15. A metal oxide thin film formed by the sputtering target according to claim 14.

16. A semiconductor film comprising the metal oxide thin film according to claim 15.

17. A thin film transistor comprising the semiconductor film according to claim 16.

18. A semiconductor device comprising the thin film transistor according to claim 17.

19. A sintered body comprising an indium oxide crystal, and aluminum oxide solid-dissolved in the indium oxide crystal, the sintered body having an atomic ratio of indium and aluminum defined as the (aluminum/(total of aluminum and indium)×100) of 0.001% or more and less than 45%, and the indium oxide crystal having a grain size of less than 10 μm, and comprising a metal ion having a positive valence of 4 or more in an amount of 10 to 5000 atomic ppm.

20. The sintered body according to claim 19, wherein the atomic ratio is 0.001 to 30 atom %.

21. The sintered body according to claim 19, wherein the atomic ratio is 0.001 to 15 atom %.

22. The sintered body according to claim 19, wherein the indium oxide crystal has a bixbyite structure.

23. The sintered body according to claim 19, wherein the indium oxide crystal in which aluminum oxide is solid-dissolved having a lattice constant within a range between the lattice constant of $InAlO_3$ and the lattice constant of $In_2O_3$.

24. The sintered body according to claim 19, comprising the metal ion having a positive valence of 4 or more in an amount of 100 to 2000 atomic ppm.

25. The sintered body according to claim 19, wherein the metal ion having a positive valence of 4 or more is one or both of a tin ion and a cerium ion.

* * * * *